United States Patent [19]

Mankut et al.

[11] Patent Number: 4,781,811

[45] Date of Patent: Nov. 1, 1988

[54] DEVICE FOR FEEDING GAS INTO A LIQUID

[75] Inventors: Ludwig Mankut, Altdorf; Peter Kuhn, Berlin, both of Fed. Rep. of Germany

[73] Assignee: Schering Aktiengesellschaft, Berlin & Bergkamen, Fed. Rep. of Germany

[21] Appl. No.: 43,199

[22] Filed: Apr. 24, 1987

[30] Foreign Application Priority Data

Apr. 24, 1986 [DE] Fed. Rep. of Germany ....... 3614067

[51] Int. Cl.⁴ ..................... C25D 17/00; B01D 47/02; C10J 1/08
[52] U.S. Cl. ..................... 204/273; 204/277; 204/278; 261/122; 261/124
[58] Field of Search ................ 261/122, 124; 204/273, 204/277, 278

[56] References Cited

U.S. PATENT DOCUMENTS

| | | | |
|---|---|---|---|
| 1,759,983 | 5/1930 | Houston | 261/122 |
| 3,259,049 | 7/1966 | Uithoven | 204/277 X |
| 3,746,516 | 7/1973 | Michaud | 261/122 X |
| 3,959,112 | 5/1976 | Arend, Jr. | 204/277 X |
| 4,270,995 | 6/1981 | Goodridge et al. | 204/277 X |
| 4,639,354 | 1/1987 | Bischoff et al. | 261/122 X |

*Primary Examiner*—Donald R. Valentine
*Attorney, Agent, or Firm*—Michael J. Striker

[57] ABSTRACT

The device for feeding a gas, particularly air into a liquid body present in an open container, includes a housing whose lower part is provided with a gas inlet opening and whose top wall is formed with a plurality of perforations. An inner perforated partition divides the housing into an upper chamber and a lower chamber communicating with the inlet opening. To create a dynamic pressure gradient between the two chambers, the perforations in the inner partition have substantially smaller diameter than the perforations or gas outlet openings in the top wall of the housing and the combined area of the perforations in the inner partition is substantially less than the cross sectional area of the gas inlet opening.

14 Claims, 3 Drawing Sheets

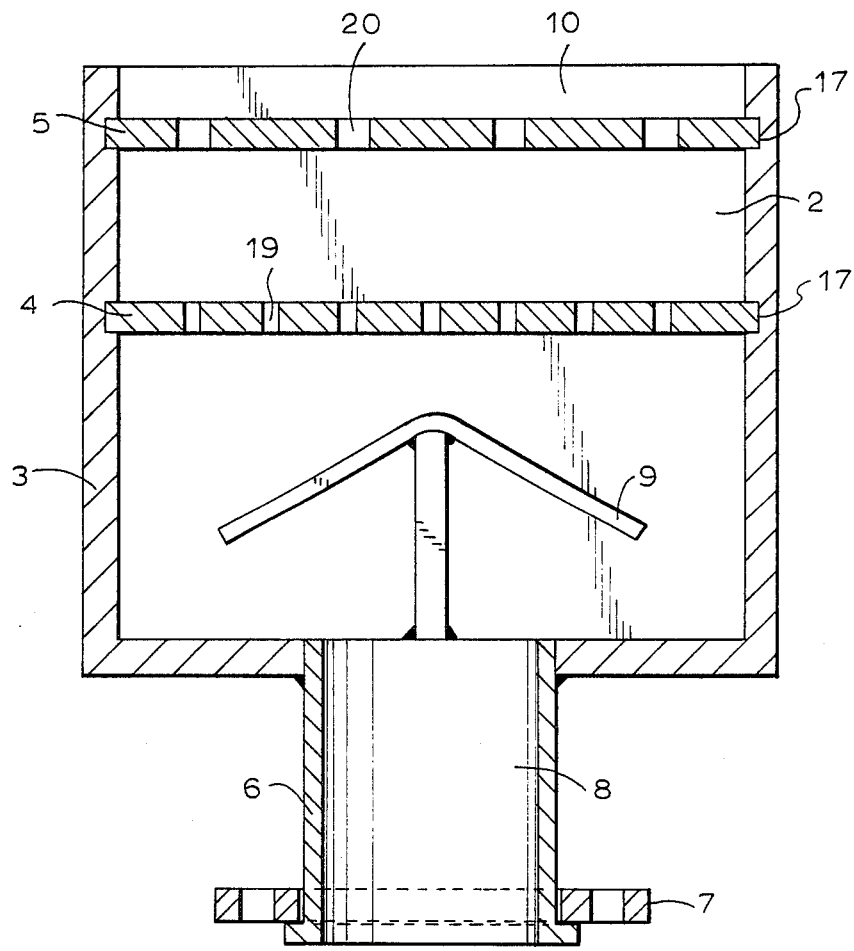
F I G. 1

DEVICE FOR FEEDING GAS INTO A LIQUID

BACKGROUND OF THE INVENTION

The present invention relates to a device for feeding a gas, particularly air, into a liquid contained in an open receptacle and also relates to method of agitating the liquid by such a device.

The injection of a gas into a liquid present in an open container such as for example a galvanizing or electroplating bath, is known since long time. Even if this liquid agitating method cannot be employed in all kinds of galvanizing baths, in principle it has proved to be very advantageous. Due to the injection of air an intensive agitation of the bath results.

It is conventional to introduce air in the bath in such a manner that a perforated pipe is arranged below and parallel to a rod on which articles to be electroplated are suspended. The perforations in the air injection pipe are provided along its longitudinal axis in one or more rows. The air injection pipe is connected to an air supply conduit for feeding in air at higher pressure than the ambient air pressure. The pressure difference must be at least such as to overcome the pressure of the liquid column around the air injection pipe.

Air exiting from the air injection pipe ascends in the liquid and causes the same to circulate. Since, as mentioned before, the air injection pipe in the galvanizing bath is arranged below the supporting rod for the articles, a relative movement between the bath and the articles is generated. This relative movement has the advantageous affect that fresh bath solution or electrolyte is continuously supplied to the upper surface of the treated articles.

If the bath is not agitated, the electrolyte exchange occurs very slowly. For this reason, during the electroplating process the composition of the electrolyte in the region adjoining the upper surface of the treated articles is subject to change. For example, in the boundary region there is less amount of metal ions inasmuch they are continuously deposited on the electroplated articles. This phenomenon is called the "impoverishment" of the electrolyte in this region. As a sequence the galvanizing current by means of which the metallic coating is deposited must be kept low in order to obtain the desired quality of the deposited coating. Since the applicable current density is low, it takes a relatively long time until a coating with a desired thickness is obtained. However, in order to reduce the number of galvanizing cells needed for the electroplating of a given upper surface of the treated articles, it is desirable to achieve the lowest electroplating time as possible. The agitation of the galvanizing bath by means of injected air is a measure for achieving this objective.

In conventional embodiments of the air injecting devices, it has been found to be difficult to maintain a uniform distribution of air exiting from the air injection pipe.

The uniformity of distribution of the exiting air must fulfill high requirements inasmuch as the uniformity of the deposited metal layer depends directly thereon. Especially in the case of electronic components such as for example printed circuit boards, very narrow tolerances as regards the thickness of the deposited layers are permissible.

There are different reasons for which a uniform distribution of the exiting air in the prior art devices, is rendered difficult. It has been necessary to maintain the air injection pipe, namely the row of the air outlet bores thereof, in an absolutely horizontal position. Furthermore, the pipe must have been stiff in order to avoid its sagging when the device is not in operation becasue when the pipe is bent, the liquid which enters the pipe is nonuniformly expelled when the device is put into operation. On the other hand, if the pipe is filled with air, the resulting uplift may even bend the pipe upwards.

To achieve a substantially uniform distribution of the air discharge over the entire length of the pipe it is conventional to provide the outlet bores at the lower side of the pipe. In this manner, when the operation is started volume of the pipe is filled with air before the latter starts uniformly exiting through the bores. This desired affect, however, can be achieved only then when the cross section of the pipe, the diameters of the bores and the distribution and number are selected in an optimal harmony. Since there is also necessary to meet other requirements for example the bores must not be made too small because resulting air bubbles would too small and would stick to the upper surface of the treated articles, it is difficult to find a solution in conventional devices of this kind which would satisfactorily meet all these requirements.

SUMMARY OF THE INVENTION

It is, therefore, a general object of this invention to provide a device and a method of feeding gas into a liquid wherein the before described disadvantages of prior art devices and methods are eliminated. In particular, it is an object of this invention to provide an absolutely uniform distribution of a gas, particularly of air, during its introduction into a liquid.

Another object of this invention is to provide a uniform intensive agitation of the liquid by the introduced air.

In keeping with these objects and others which will become apparent hereafter, one feature of this invention resides in performing the two functions of the air feeding device, namely the distribution of the gas over a predetermined length and the calibration of bubbles, in two separate stages. For this purpose, there are employed two superposed chambers each provided with a row of perforations or openings to distribute the supplied air. The individual perforations in the lower chamber have a substantially smaller cross section than that of the perforations in the upper chamber and the combined cross sectional area of the air exit openings in the lower chamber being less than is the cross sectional area of an inlet opening for the supplied air. In this manner, in the perforations of the lower chamber a relatively strong pressure drop and pressure gradient occurs. The value of the pressure drop is maintained within predetermined limit values of the pressure of the supplied air. The air discharge perforations of the second chamber into which the air from the first chamber is introduced are dimensioned such that the desired diameter of air bubbles exiting into the liquid filled container, is obtained. In the preferred embodiment of this invention, the device consists of a housing having a open top and a bottom wall provided with the air inlet opening, an uper partition exchangeably arranged at the open top of the housing, a lower partition exchangeably arranged at a distance below the upper partition to divide the interior of the housing into an outer chamber and an inner chamber, and both partitions being formed with perforations whereby the diameter of perforations in the lower partition being substantially smaller than that in the upper partition and the combined cross sectional areas of the perforations in the lower partition being less than the cross section area of the air inlet opening.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawing.

BRIEF DESCRIPTION OF THE DRAWING

FIG. 1 is a sectional view of an embodiment of the device of this invention;

DESCRIPTION OF THE PREFERRED EMBODIMENTS

Figure 2:
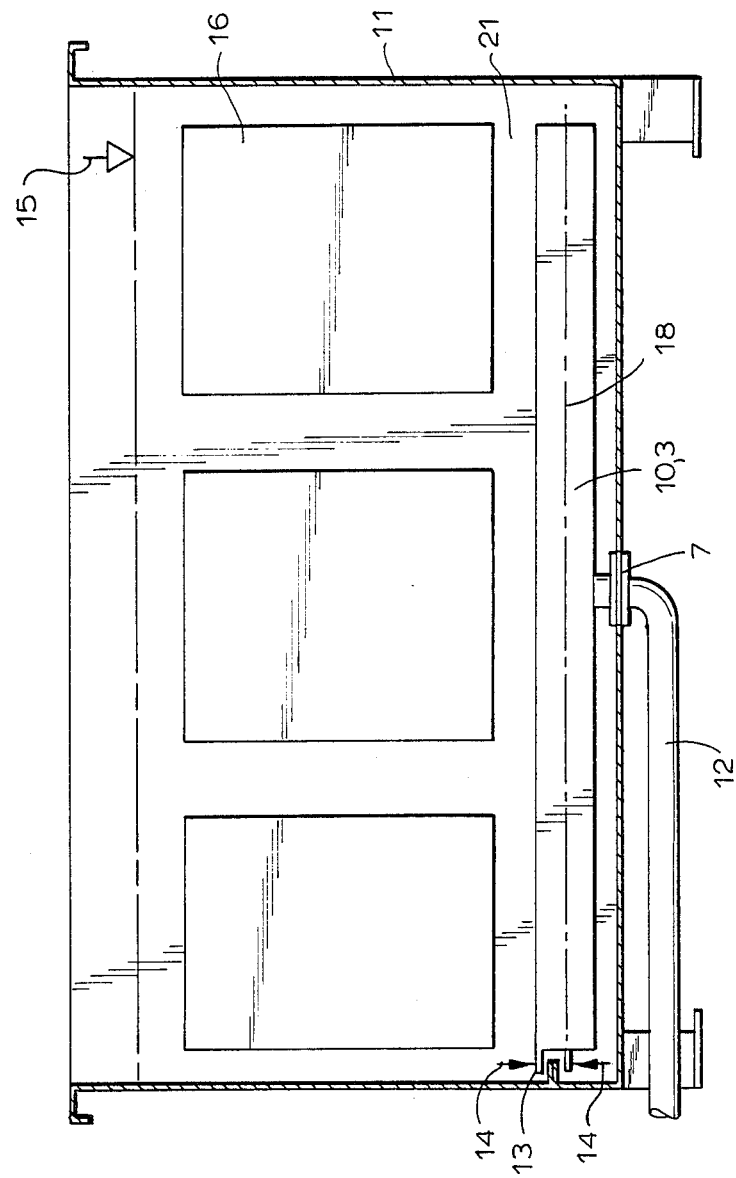
FIG. 2 shows on a reduced scale a longitudinal section of a galvanizing bath incorporating the device of FIG. 1.

In FIG. 1, there is illustrated an air injection device 10 having two superposed chambers 1 and 2. The device consists of an elongated housing 3 of a U-shaped cross section having an open top and a bottom wall provided with a connection piece 6 for supplying air into the lower chamber 1. The connection piece is provided with a mounting flange 7. A buffer or deflecting plate 9 is arranged opposite the air inlet opening 8 in order to prevent air incoming in the lower chamber 1 from reaching immediately a perforated inner partition 4 separating the lower chamber 1 from the upper chamber 2. The upper chamber is delimited by a perforated outer partition 5.

FIG. 2 shows on a reduced scale and in a longitudinal view the device 10 installed in a container 11 for an electroplating bath. Air is supplied into the device 10 via a conduit 12 fastened to the mounting flange 7 of the connection piece or the air inlet opening. The end walls of the housing 3 are removable in order to introduce into the guide grooves 17 the perforated partitions, as it will be described below. An end wall is provided with a position adjusting device 13 by means of which the exact horizontal positon of the device is set as indicated by arrows 14. The container contains an electrolyte whose level is indicated by reference numeral 15, and articles 16 to be electroplated are suspended in the electrolyte liquid. Other components necessary for the electroplating process, such as anodes and electricl terminals for applying electrical current to the anodes and to the articles 16 are omitted for the sake of clarity.

As illustrated in FIG. 1, the perforated partitions 4 and 5 delimiting the upper and lower chambers 1 and 2 are inserted into guide grooves 17 in the inner wall of the housing 3. For this purpose a nonillustrated end wall of the housing is made removable. In this manner the perforated partitions can be easily exchanged.

All components parts of the device 10 are made of a plastic material. Due to the shape of the housing 3 and the dimensions of the remaining component parts, any deformation of the device 10 in the direction of the longitudinal axis 18 is reliably prevented.

It will be seen from the drawing, the diameter of individual openings or perforations 19 in the lower partition 4 is substantially smaller than the diameters in the upper partition 5. The combined area of all fine openings 19 in the partition 4 is also substantially smaller than the cross sectional area of the gas inlet opening 8 or of the pipe 12. As a consequence, the supplied air in the inner chamber 1 is dammed-up and pressurized and a pressure gradient occurs beteen the chambers 1 and 2.

The perforations or openings 2 and 3 in the upper partition 5, which are substantially larger than those in the lower partition have a size which is adjusted for the creation of air bubbles which are optimized for particular process conditons in the galvanizing cell 21.

The coarse combined area of the upper openings or perforations 20 is adjusted such that no substantial pressure difference occurs between the outer chamber 2 and the column of liquid electrolyte above the partition 5. Consequently, the upper chamber 2 is partially filled with liquid. Air exiting through fine openings 19 in the lower partition 4 accumulates in a completely uniform layer below the inner surface of partition 5 and after passing through the openings 20, the resulting bubbles are "calibrated" to the desired size and uniformly ascend in the liquid along the articles being galvanized.

In starting the operation of the device 10, any liquid present in the lower chamber 1 is expelled therefrom by the pressurized air.

Figure 3:
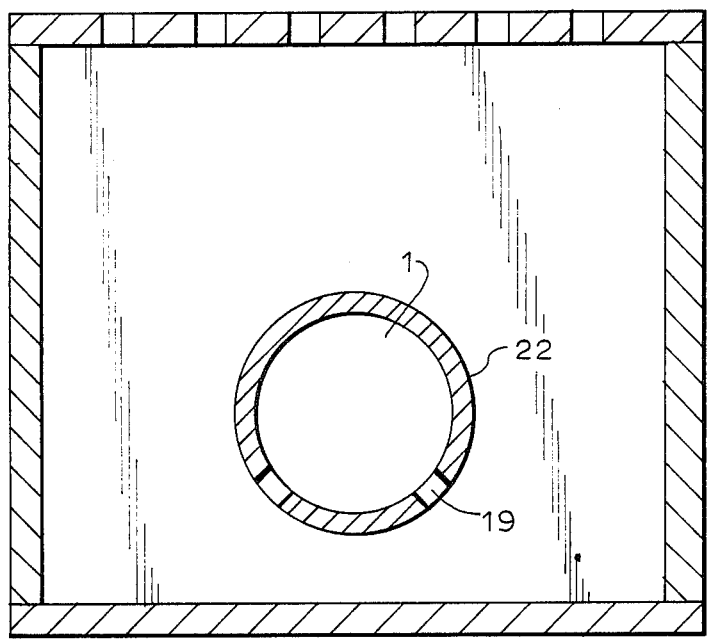
FIG. 3 is a sectional view of another embodiment of the device of this invention.

Another embodiment of the device of this invention is shown in FIG. 3. In this embodiment, the inner chamber 1 is formed by a pipe 22 inserted into the outer chamber 2. In this example, the air exit openings 19 are directed downwards. The air is supplied into the chamber 1 through inlets formed in one or both the opposite end walls of the housing 3.

Preferably, the opneings 19 and 20 are bores having circular cross section. In a modification, the openings can have a different contour, for example they can be in the form of elongated slots.

While the invention has been illustrated and described as embodied in connection with an electroplating bath for metallizing electronic components such as printed circuit boards, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A device for feeding a gas into a liquid contained in an open receptacle, comprising a housing having a top wall formed with a first array of gas outlet openings communicating with the liquid to determined a desired side of bubles fed therein; an inner partition arranged at a distance below said top wall to divide the interior of said housing into a lower chamber and an upper chamber, said inner partition being formed with a second array of gas outlet openings exceeding in number the openings in said first array and having sectional areas which are smaller than the areas of openings in said first array to produce gas pressure in said upper chamber which is substantially equal to a pressure exerted against said top wall by the liquid in the open receptacle; a gas inlet opening formed in a lower part of said housing and communicating with said lower chamber; and combined sectional areas of the openings in said second array being substantially smaller than the sectional area of said gas inlet opening to dam up gas in said lower chamber.

2. A device as defined in claim 1, wherein said top wall of the housing is in the form of an outer partition.

3. A device is defined in claim 2, wherein an end wall of the housing is removable and said inner and outer partitions are removably attached to the inner wall of said housing.

4. A device as defined in claim 1, wherein said gas outlet openings in said top wall and in said inner partition have a circular cross section.

5. A device as defined in claim 1, wherein said gas outlet openings in said top wall and in said inner partition have a slot-like configuration.

6. A device as defined in claim 1, wherein said housing has a U-shaped cross section.

7. A device as defined in claim 1, wherein said housing is installed in a receptacle for a galvanizing bath.

8. A device as defined in claim 1, wherein said all structural parts thereof are made of a plastic material.

9. A device as defined in claim 1, wherein a predetermined gas pressure gradient is created between the lower and upper chambers due to damming up of the supplied gas in the lower chamber.

10. A device as defined in claim 1; and further including a buffer plate arranged in said lower chamber above said gas inlet opening.

11. A device as defined in claim 1, wherein said lower chamber is in the form of a pipe passing through a side wall of said housing and being provided with said second array of downwardly directed gas outlet openings.

12. A method of agitating a galvanizing bath contained in an open receptacle comprising the steps of feeding an agitation gas stream through an inlet into a lower chamber, pressurizing the lower chamber by continuously releasing the fed-in gas through an array of fine openings into an upper chamber whereby the combined area of said fine openings is less than the area of said inlet, reducing gas pressure in the upper chamber by continuously releasing the gas through an array of coarse openings into a bottom layer of the galvanizing bath whereby the combined area of said coarse openings exceeds that of said fine openings and is adjusted such that the reduced gas pressure is substantially equal to the pressure of the galvanizing bath.

13. A method as defined in claim 12 wherein the galvanizing bath serves for plating electric components suspended above said array of coarse openings whereby uniformly distributed gas bubbles exiting through said coarse openings agitate or circulate the bath.

14. A method as defined in claim 13 wherein said electric components are printed circuit boards.

* * * * *